United States Patent
Ichikawa et al.

(10) Patent No.: US 8,531,092 B2
(45) Date of Patent: Sep. 10, 2013

(54) SURFACE-MOUNTABLE PIEZOELECTRIC DEVICES INCLUDING EUTECTIC-BONDED PACKAGES

(75) Inventors: Ryoichi Ichikawa, Saitama (JP); Shuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 314 days.

(21) Appl. No.: 13/092,871

(22) Filed: Apr. 22, 2011

(65) Prior Publication Data
US 2011/0260585 A1    Oct. 27, 2011

(30) Foreign Application Priority Data

Apr. 27, 2010 (JP) ................. 2010-102341
Oct. 21, 2010 (JP) ................. 2010-236048

(51) Int. Cl.
*H01L 41/053* (2006.01)
(52) U.S. Cl.
USPC ............ 310/364; 310/344; 310/348; 310/363
(58) Field of Classification Search
CPC .................................................. H03H 9/1021
USPC ................. 310/344, 348, 363, 364
See application file for complete search history.

(56) References Cited

U.S. PATENT DOCUMENTS

| | | | |
|---|---|---|---|
| 6,700,312 B2 * | 3/2004 | Iizuka et al. | 310/364 |
| 8,373,334 B2 * | 2/2013 | Aratake | 310/370 |
| 2004/0218769 A1 * | 11/2004 | Kami et al. | 381/189 |
| 2011/0221309 A1 * | 9/2011 | Umeki | 310/344 |

FOREIGN PATENT DOCUMENTS

| | | |
|---|---|---|
| JP | 2003-332876 | 11/2003 |
| JP | 2004-200835 | 7/2004 |
| JP | P3821435 | 11/2004 |

* cited by examiner

*Primary Examiner* — Derek Rosenau
*Assistant Examiner* — Bryan Gordon
(74) *Attorney, Agent, or Firm* — Klarquist Sparkman, LLP

(57) ABSTRACT

Piezoelectric devices are disclosed that are mountable on the surface of a printed circuit board or the like. An exemplary device comprises a piezoelectric vibrating piece enclosed and sealed within a package including at least a cover and a base-substrate formed of glass or piezoelectric material. The package includes frame-shaped metallic films formed in peripheral regions of inner main surfaces of the cover and/or the base substrate. The frame-shaped metallic films are used for sealing the package using a eutectic material (e.g., solder). At least one mounting terminal is provided on the outer (bottom) main surface of the base-substrate. At least one of the frame-shaped metallic films and mounting terminals includes a chromium foundation layer formed on the surface of the glass or piezoelectric material, a middle layer of NiW alloy formed on the surface of the chromium layer, and a gold layer formed on the surface of the middle layer.

21 Claims, 13 Drawing Sheets

SURFACE-MOUNTABLE PIEZOELECTRIC DEVICES INCLUDING EUTECTIC-BONDED PACKAGES

CROSS-REFERENCE TO RELATED APPLICATIONS

This application claims priority to and the benefit of Japan Patent Application No. 2010-102341, filed on Apr. 27, 2010, and Japan Patent Application No. 2010-236048, filed on Oct. 21, 2010, in the Japan Patent Office, the disclosures of which are incorporated herein by reference in their respective entireties.

FIELD

This disclosure pertains to, inter alia, piezoelectric devices in packages sealed with eutectic alloy, wherein the piezoelectric device is mountable on the surface of a printed circuit board or the like. More particularly, the disclosure pertains to electrode structures in such devices that include sealing surfaces (joint faces) and external mounting terminals of a package member, wherein the sealing surfaces and the mounting terminals are bonded, during package assembly, with the eutectic alloy.

DESCRIPTION OF THE RELATED ART

The piezoelectric device is known as a frequency-controlling and frequency-selecting element. Piezoelectric devices are incorporated in a variety of communications apparatus as components that are indispensable for consumer-use digital-control apparatus. Many of these conventional piezoelectric devices include surface-mountable quartz-crystal vibrators comprising packages of which the base-substrate is made of glass or synthetic quartz crystal instead of ceramic. In recent years, there has been substantial industrial pressure to reduce manufacturing costs of these devices in view of their increased demand. Example devices are discussed in Japan Patent No. 3,621,435 and in Japan Unexamined Patent Publication No. 2009-194091.

FIGS. 10A-10C depict a conventional piezoelectric device. FIG. 10A is a sectional view of a quartz-crystal vibrator, which comprises a quartz-crystal vibrating piece enclosed in a "package"; FIG. 10B is a plan view of the base-substrate of the package; and FIG. 10C is a plan view of the quartz-crystal vibrating piece. This conventional quartz-crystal vibrator is constructed by assembling and sealing a quartz-crystal vibrating piece 4 within a package 3, wherein the package consists of a base-substrate 1 and a cover 2, to form a piezoelectric vibrator. The base-substrate 1 and cover 2 are rectangular in plan view. Both are made of the same type of glass, for example a borosilicate glass. The base-substrate 1 is planar, while the inner main surface of the cover 2 includes a concavity that faces the quartz-crystal vibrating piece 4 in the package 3. This quartz-crystal vibrator has a pair of quartz-crystal mounting pedestals 5 near one edge of the upper main surface of the base-substrate 1 and a frame-shaped metallic film 6a on the periphery of the upper surface of the base-substrate 1. External mounting terminals 7, by which this piezoelectric device is attached to a printed circuit board, are provided on the bottom main surface of the base-substrate 1 near respective edges thereof.

The quartz-crystal mounting pedestals 5 are connected electrically to the respective mounting terminals 7 via respective through-electrodes. The through-electrodes are configured as respective metallic films on the inside walls of corresponding through-holes previously formed in the base-substrate 1. The circuit pattern comprising the quartz-crystal mounting pedestals 5, the through-electrodes 8, and the external mounting terminals 7 is formed by photo-etching. The through-electrodes 8 are filled with metal for sealing purposes. The frame-shaped metallic film 6a, the mounting terminals 7, and the circuit pattern are configured as respective metal films comprising two layers: a foundation layer of chromium (Cr) and a surface layer of gold (Au) applied on the Cr layer. As a consequence of the base-substrate 1 being planar, planar circuit patterns can be formed on it easily compared to a case in which the base-substrate 1 has a concavity or other surface irregularity.

The quartz-crystal vibrating piece 4 is made of, for example, AT-cut quartz crystal exhibiting a thickness-shear vibration mode. The vibrating piece 4 includes respective excitation electrodes 4a on both main surfaces thereof and extraction electrodes 4b extending on both main surfaces toward one edge of the quartz-crystal vibrating piece 4. Near that edge of the quartz-crystal vibrating piece 4, the quartz-crystal vibrating piece is bonded to the respective upper surfaces of the mounting pedestals 5 using conductive adhesive 9. This bonding also yields electrical connection of the extraction electrodes to respective mounting pedestals 5. The conductive adhesive 9 is, for example, silicon-based and thermally cured. It has a curing temperature of 280° C. and a curing time of 90 minutes, for example.

The inner main surface of the cover 2 includes a surface that is peripheral to the concavity. This surface includes a frame-shaped metallic film 6b corresponding to the frame-shaped metallic film 6 on the base-substrate 1.

The frame-shaped metallic film 6b comprises a foundation layer of Cr and a surface layer of Au, similar to the frame-shaped metallic film 6a on the base-substrate 1. The Cr foundation layer is used because a metal such as gold adheres poorly to a mirror-polished glass surface. The surface layer is Au because of the chemical stability of this element. Other electrodes also have this two-layer construction, namely the excitation electrodes 4a and the extraction electrodes 4b of the quartz-crystal vibrating piece 4.

After bonding the quartz-crystal vibrating piece 4 to the base-substrate 1, the inner main surface of the base-substrate 1 is bonded to the inner main surface of the cover 2 by soldering together the frame-shaped metallic films 6a, 6b. The solder is made of a eutectic alloy such as AuSn, AuGe, or AuSi.

These operations of forming base-substrates 1, forming covers 2, and soldering these parts together are usually performed simultaneously on a large number of devices by performing these operations on respective wafers 1A, 2A on which hundreds or thousands of devices are formed. The wafers are termed the "base-substrate wafer" 1A and the "cover wafer" 2A. Base-substrates 1 on the base-substrate wafer 1A and respective covers 2 on the cover wafer 2A are arranged so that they are alignable with each other by aligning the wafers 1A, 2A. Ie., a base-substrate wafer 1A and cover wafer 2a are aligned with each other longitudinally and laterally, as shown in FIGS. 11A-11B. FIG. 11A is a plan view of a portion of the base-substrate wafer 1A containing four base-substrates 1, and FIG. 11B is a plan view of a corresponding portion of the cover wafer 2A containing four covers 2. In both figures, the respective inner main surfaces are shown, which are the surfaces that become bonded together to form the package. To such end, visible are the frame-shaped metallic film 6a of the base-substrates 1 and the frame-shaped metallic film 6b of the covers 2.

According to International Publication No. WO2008/140033, Japan Patent Application No. 2009-213925, Japan Patent Publication No. 2011-066566, Japan Patent Application No. 2009-218703, and Japan Patent Application No. 2010-42471, small balls of a eutectic alloy (each referred to hereinafter as a "eutectic ball") are placed between the frame-shaped metallic films 6a and 6b on the base-substrate wafer 1A and cover wafer 2A, respectively. The eutectic balls are destined to form solder used for bonding the wafers together. Specifically, the eutectic balls are melted by application of heat, which causes the eutectic to flow over and between the juxtaposed frame-shaped metallic films 6a, 6b. Thus, the base-substrate wafer 1A is bonded to the cover wafer 2A. According to International Publication No. WO2008/140033, eutectic alloy 10 is applied to the frame-shaped metallic films 6a, 6b to form eutectic balls 10A in situ. According to Japan Patent Application No. 2009-213925, Japan Patent Publication No. 2011-066566, Japan Patent Application No. 2009-218703, and Japan Patent Application No. 2010-42471, previously formed eutectic balls 10A are placed on the frame-shaped metallic films 6a, 6b.

In FIGS. 11A and 11B, each corner of each frame-shaped metallic films 6a, 6b, respectively, is located adjacent three neighboring corners. Each of these four-corner regions includes a ring-shaped pad, constructed similarly to the frame-shaped metallic films 6a, 6b. Each ring-shaped pad includes a central shallow hole 11, of which the surfaces are bare glass. Each ring-shaped pad contacts and connects together all four respective corners. According to Japan Patent Application No. 2010-42471, respective eutectic balls 10A are placed on each ring-shaped pad (FIG. 12A). When the balls are melted, eutectic material flows onto the ring-shaped pad and to the four corners. Thus, the four corners are connected together electrically by the eutectic and the respective ring-shaped pad.

More specifically, a respective eutectic ball 10A is placed in each shallow hole 11 on the base-substrate wafer 1A. Next, the cover wafer 2A is aligned with and moved toward the base-substrate wafer 1A so that the eutectic balls 10A also become positioned in respective shallow holes in the ring-shaped pads on the cover wafer 2A. The wafers 1A, 2A are brought together face-to-face (FIG. 12a), after which the eutectic balls 10A are melted. The resulting melts of eutectic flow onto the ring-shaped pads and over the frame-shaped metallic films 6a, 6b on each wafer, as indicated by respective arrows in FIG. 12B. The eutectic thus bonds together the frame-shaped metallic films 6b of each base-substrate 1 on the base-substrate wafer 1A with respective frame-shaped metallic films 6a of each respective cover 2 on the cover wafer 2A, thereby forming a "package wafer" (basically a two-wafer sandwich of the base-substrate wafer 1A and the cover wafer 2).

After its formation, the package wafer is cut into individual packages 3 along lateral X-X cut lines and longitudinal Y-Y cut lines (extending between adjacent frame-shaped metallic films 6a, 6b) to yield multiple surface-mountable piezoelectric vibrators. Since the adjacent frame-shaped metallic films 6a, 6b on respective peripheral surfaces of the base-substrates and covers are separate from each other, the cut lines extend along bare glass, which facilitates accurate and clean cutting of the package wafer. The surfaces of the small holes 11 are bare glass for the same reason.

However, conventional quartz-crystal vibrators configured and produced as summarized above (specifically by melting the eutectic balls to produce eutectic melt that must flow over the frame-shaped metallic films 6a, 6b) have a problem in which the air-tightness by which the base-substrates and corresponding covers are bonded together is often compromised. FIG. 13A depicts a eutectic ball 10A placed on a shallow hole 11 at a locus at which four frame-shaped metallic films 6a come nearly together. The eutectic ball 10A is melted by application of heat. The resulting eutectic melt flows over the surfaces of respective frame-shaped metallic films 6a (FIG. 13A). FIG. 13A is a partial sectional view of such a locus before melting the eutectic ball. FIG. 13B is a partial plan view of the same region as FIG. 13A, after melting the ball, and FIG. 13C is a sectional view along the line B-B of FIG. 13B.

When the eutectic ball 10A at the depicted locus has been melted, the thickness of the melt flowing away from the shallow hole becomes progressively less with increased distance from the locus over the frame-shaped metallic films 6a, 6b. The melts are thickest at the locus. Flow of the melt over the frame-shaped metallic films 6a, 6b is shown in FIG. 13B. This flow has a thickness gradient in which the thickness of the melt decreases with increased distance from the locus. Also, porosities 12 tend to form particularly near the loci at which the eutectic balls were originally placed. At each porosity, the underlying glass material is exposed (see FIGS. 13B and 13C). This phenomenon occurs even when the size of the eutectic balls 10A is increased to increase the amount of the eutectic melt. As a result of these phenomena, package sealing midway between the loci tends to be deficient.

Formation of porosities 12 also decreases the strength of the eutectic bonds between the frame-shaped metallic films 6a and 6b. As a result, the frame-shaped metallic film 6a, 6b may be peeled easily from the base-substrate 1 or cover 2 upon receiving a physical impact. Although not shown in the figures, another problem that arises whenever one of these conventional piezoelectric devices is mounted on a printed circuit board by soldering is inter-diffusion of elements between the mounting terminals 7 and the solder, which produces porosities in the molten metal. As a result, the bonding strength between the mounting terminals 7 and the base-substrate 1 is weakened, which increases the likelihood of the mounting terminal 7 becoming detached from the base-substrate.

SUMMARY

In view of the foregoing, the present invention provides, inter alia, piezoelectric devices in which the frame-shaped metallic films and/or the mounting terminals comprise a layer of chromium (Cr), a nickel-tungsten (NiW) alloy layer formed on the surface of the Cr layer, and a gold layer (Au) formed on the surface of the NiW alloy layer. This combination of layers prevents package-sealing failures and prevents weakening of eutectic joint strength between the base-substrate and the cover of the device.

In the development of this invention, attention was directed to the gradient of eutectic thickness on the frame-shaped metallic films 6a, 6b over which the eutectic melt flows, as influenced by the composition of the metallic films. In conventional processes, the frame-shaped metallic films 6a, 6b are formed in the same process step in which circuit patterns are formed, i.e., by sputtering to deposit Cr as the foundation layer and to deposit Au as the surface layer. Whenever a eutectic ball 10A, comprising Au, on the metallic film is melted by heat, the molten eutectic tends to draw gold from the surface layer of the metallic film 6a.

In addition, Cr in the foundation layer of the metallic films 6a, 6b diffuses into the Au in the surface layer when the layers are heated. As a result, the Cr in the foundation layer is drawn out by the eutectic along with the drawn-out Au, thereby forming a mixed layer 13 of these metals in the frame-shaped metallic films. This results in exposure of the glass base material, as porosities 12, in the vicinity of the loci at which the eutectic balls 10A are placed. Later, after the eutectic balls 10A are melted, the porosities cause uneven flow of eutectic melt outward from the loci at which the balls were placed. This, in turn, results in a progressive thinning (i.e., a thickness gradient) of molten eutectic 10 such that maximum thickness occurs in the vicinity of the ball-placement loci, the eutectic progressively thins with increased distance from the locus. This disclosure presents a solution to this problem, achieved using a shielding layer.

According to one aspect of the invention, piezoelectric devices are provided. An exemplary embodiment of such a piezoelectric device is one intended to be surface mounted, such as on the surface of a printed circuit board. The device includes a piezoelectric vibrator that vibrates at a predetermined frequency. The device also includes a package. The package comprises at least a cover and a base-substrate made of glass or piezoelectric material. The piezoelectric vibrator is sealed in the package. The base-substrate and cover have respective inner and outer main surfaces with respective peripheral regions. At least one inner main surface comprises a respective frame-shaped metallic film extending around the respective peripheral region. The frame-shaped metallic film is used for sealing the base-substrate and cover together using a solder to form the package. The outer main surface of the base-substrate includes at least one mounting terminal. At least one of the frame-shaped metallic film and mounting terminal comprises a layer of chromium formed on a surface of the glass or piezoelectric material, a layer of NiW alloy formed on the layer of chromium, and a layer of gold formed on the layer of NiW alloy.

In some embodiments, the cover comprises a respective frame-shaped metallic film, and the base-substrate comprises a respective frame-shaped metallic film. The package can comprise the cover and base-substrate bonded together by solder that has been melted in situ, allowed to flow over the surfaces of the frame-shaped metallic films, and hardened to form the package.

In other embodiments the package comprises a frame portion that peripherally surrounds the piezoelectric vibrating piece, wherein the frame portion comprises first and second main surfaces. The cover and base-substrate include respective frame-shaped metallic films on their respective inner main surfaces. Both main surfaces of the frame portion also include respective frame-shaped metallic films. The package in these embodiments comprises the base-substrate, frame portion, and cover bonded together by a solder that has been melted in situ, allowed to flow over the surfaces of the frame-shaped metallic films, and hardened to form the package.

The layer of NiW alloy in each frame-shaped metallic film can have a smaller thickness than either the chromium layer or the gold layer. For example, the chromium layer (serving as a foundation layer) is approximately 1000 Å thick, the Au layer (serving as a surface layer) is approximately 2000 Å thick, and the layer of NiW alloy (serving as a shielding layer) is approximately 300 Å thick. Since NiW alloy is unlikely to diffuse into gold or chromium, the thickness of the layer of NiW alloy can be less than the thickness of either the gold layer or the chromium layer.

In contrast, Japan Published Patent Application No. 2003-332876 and Japan Patent No. 4,275,396 mention chromium for use as a shielding electrode. But, the thickness of the chromium shielding electrode is 2000 Å, for example, which is substantially greater than the thickness of either the chromium foundation electrode or the gold conductive electrode.

As a result, even if part of the chromium in the surface of the shielding electrode is drawn out, some chromium remains in the entire layer that functions as the shielding electrode.

In other embodiments, the layer of NiW alloy in the mounting terminals is thicker than the chromium layer.

In other embodiments, the base-substrate comprises corner castellations, wherein each mounting terminal comprises a respective side-face electrode situated in a respective castellation.

In yet other embodiments, a layer of nickel (Ni) is formed on the surface of the gold layer. A gold layer is then formed on the surface of the Ni layer. The Ni layer can be formed as a product of electroless plating and has a thickness of 3 µm to 5 µm. The gold layer formed on the Ni layer is a product of electroless plating and also has a thickness of 3 µm to 5 µm.

The solder used in any of the various embodiments summarized above can comprise a eutectic alloy. When such a solder is melted by application of heat, the NiW alloy of the shielding layer is unlikely to diffuse into the gold surface layer, as applicants have discovered from experimentation. As a result, even if molten eutectic draws Au out of the surface layer, the underlying base material is not and does not become exposed on the surface of the package. Thus, formation of porosities (which expose the base material in conventional devices) is prevented. The solder flows uniformly over the surfaces of the frame-shaped metallic films and/or the mounting electrodes to produce a substantially uniform thickness of the solder as a function of distance.

BRIEF DESCRIPTION OF THE DRAWINGS

FIGS. 1A-1C pertain to a first embodiment, in which FIG. 1A is a cross-sectional view showing the structure of a frame-shaped metallic film as formed on a base-substrate wafer in an intersection area ("locus") before the eutectic ball is melted. FIG. 1B is a plan view of the locus after the eutectic ball has been melted, and FIG. 1C is a cross-sectional view along the line B-B in FIG. 1B.

FIGS. 5A-5B depict certain details of the second embodiment, in which FIG. 5A is a plan view of a frame-shaped quartz-crystal piece, and FIG. 5B is a plan view of the upper surface of the base-substrate.

FIG. 9C is an enlargement of the region D after forming the mounting terminal 7.

FIGS. 10A-10C depict a conventional quartz-crystal vibrator, in which FIG. 10A is a sectional view of the vibrator, FIG. 10B is a plan view of the base-substrate thereof, and FIG. 10C is a plan view of the quartz-crystal vibrating piece thereof.

DETAILED DESCRIPTION

Figure 1A:
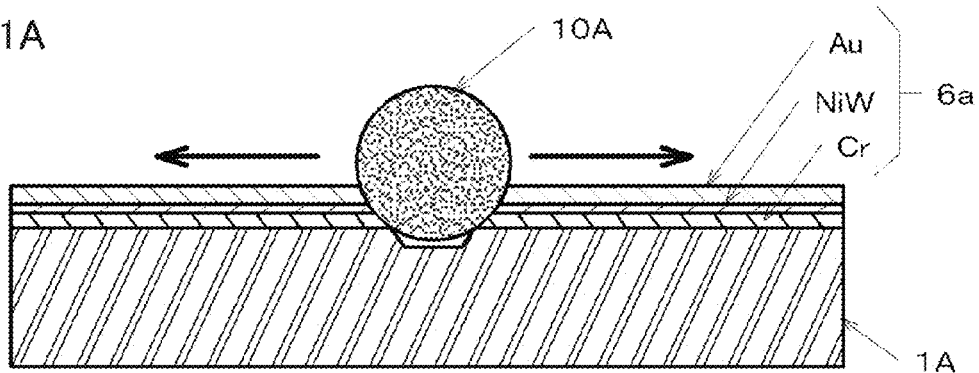

The invention is described below in the context of representative embodiments that are not intended to be limiting in any way.

First Embodiment

This embodiment is described below with reference to FIGS. 1A-1C, each depicting a respective view of an "intersection area" in a base-substrate wafer, wherein the intersection area includes the locus at which a respective eutectic ball is placed. In the description of this embodiment, features that are identical to corresponding features in the conventional base-substrate wafer summarized above have the same respective reference numerals and are not detailed further below.

Figure 10A:
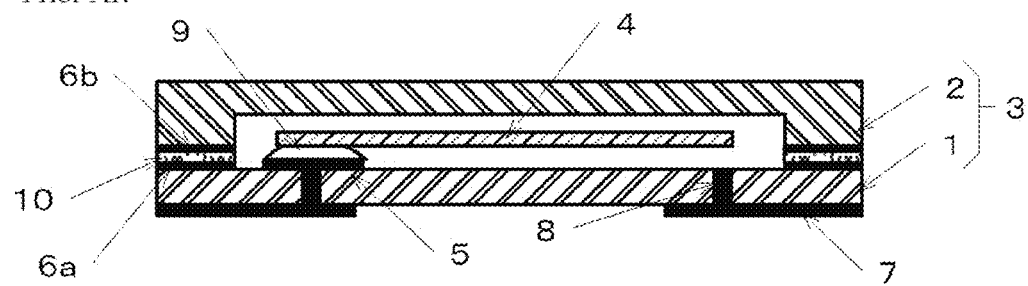
Figure 10B:
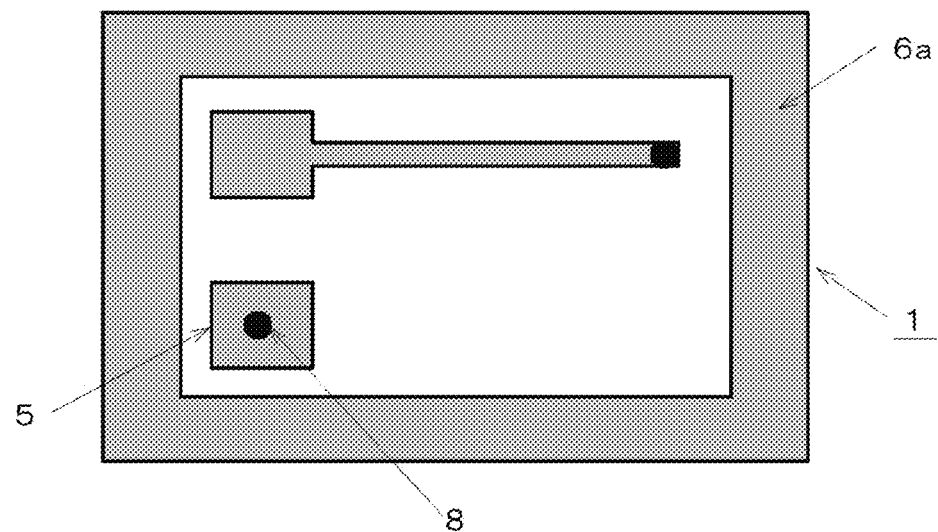
Figure 10C:
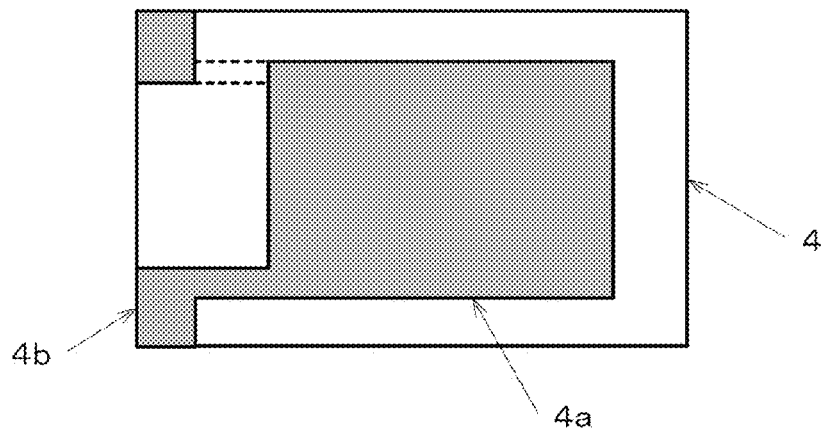
Figure 11A:
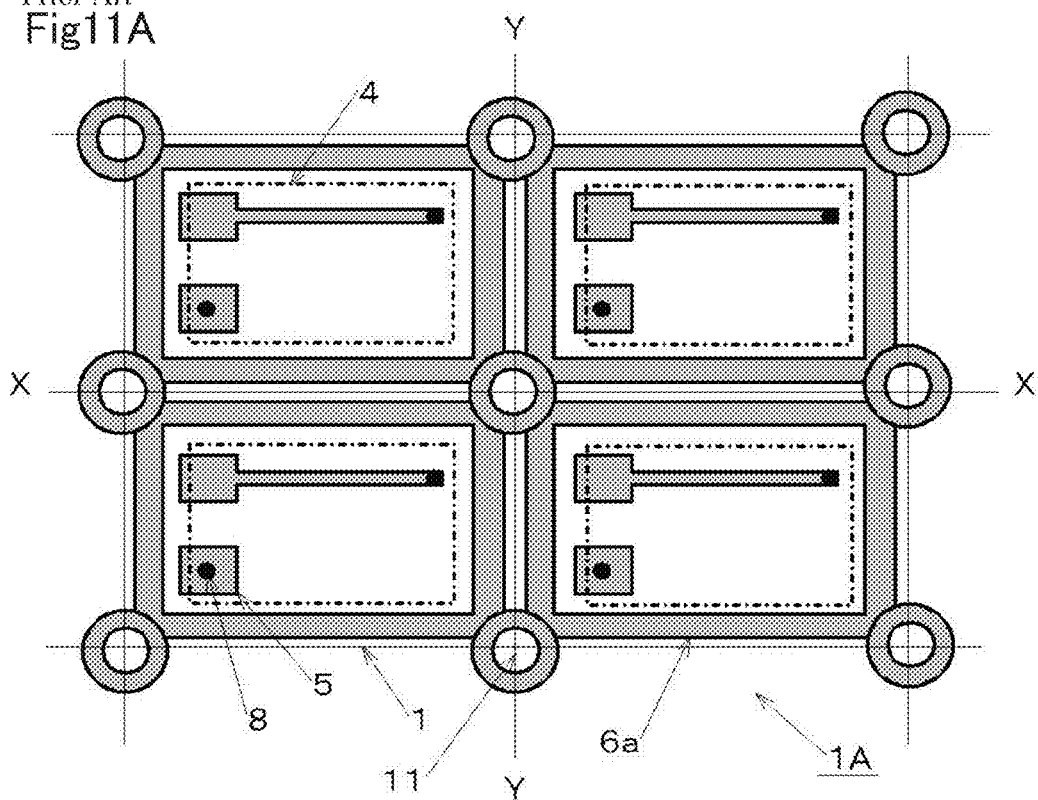
FIG. 11A is a plan view of a region of a conventional base-substrate wafer occupied by four base substrates.
Figure 11B:
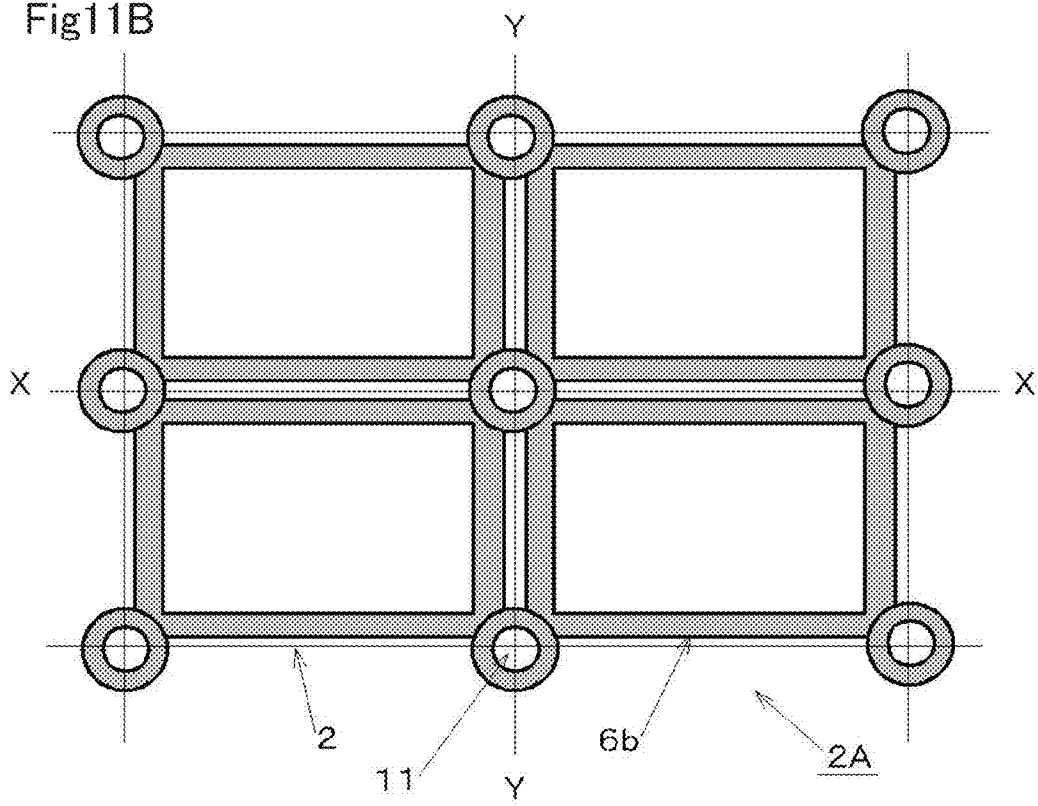
FIG. 11B is a plan view of a corresponding region of a conventional cover wafer occupied by four covers.

This embodiment, similar to the conventional quartz-crystal vibrator summarized above and shown in FIGS. 10A-10C, comprises a "recessed" cover 2 (i.e., a cover having an inner main surface defining a concavity). The recessed cover 2 is bonded to a planar base-substrate 1 that comprises a quartz-crystal vibrating piece 4 mounted to its inner main surface and at least one mounting terminal 7 on its lower (outer) main surface. The recessed cover 2 and base-substrate are bonded and sealed together using a eutectic alloy 10. The base-substrate 1 and recessed cover 2 are both made of a glassy material, such as, for example, a borosilicate glass or quartz-crystal material. FIGS. 1A-1C show a portion of a base-substrate wafer 1A (on which multiple individual base-substrates 1 are arranged) and a respective portion of a cover wafer 2A (on which multiple individual recessed covers 2 are arranged). These two wafers are bonded together using eutectic material.

Figure 12A:
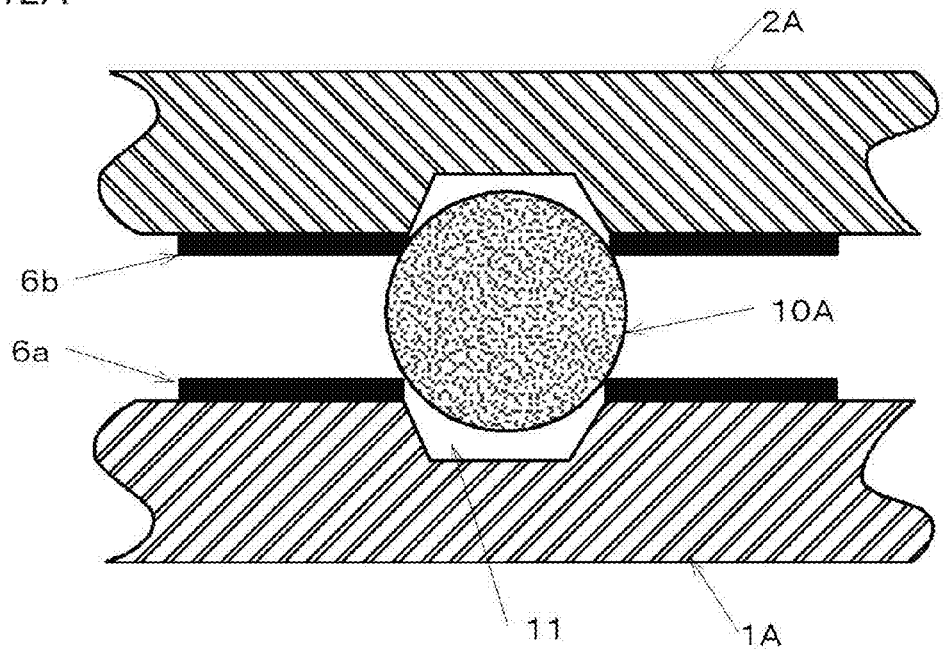
FIG. 12A is an enlarged region of a vertical section of a conventional quartz-crystal vibrator.
Figure 12B:
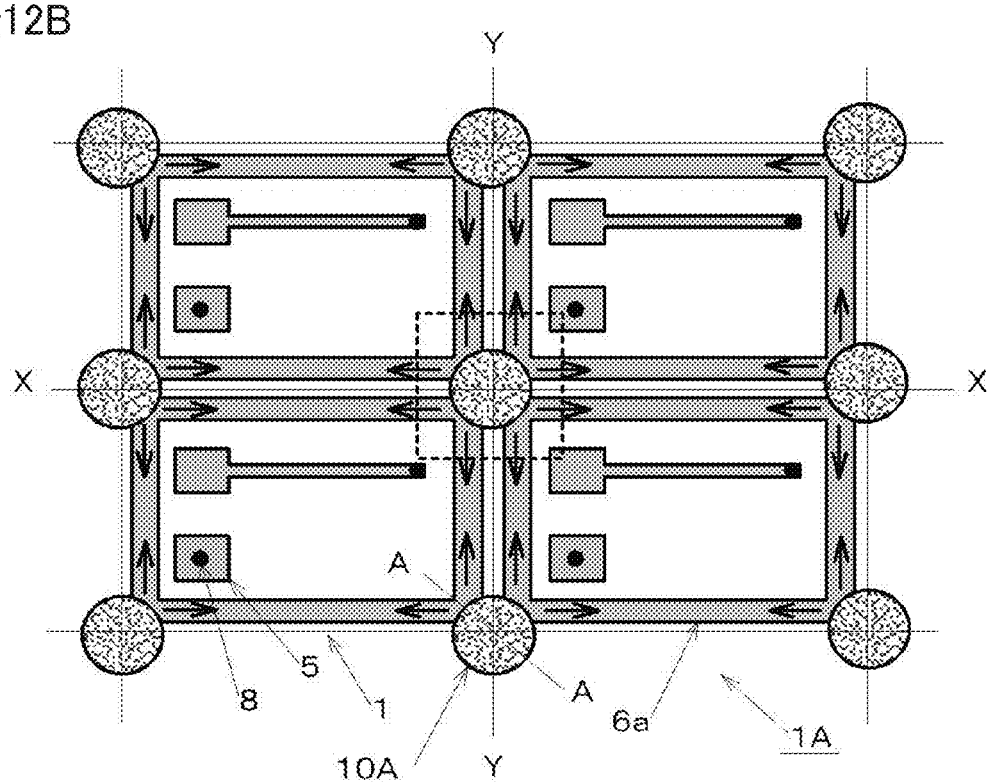
FIG. 12B is a plan view of a region of the base-substrate wafer showing eutectic balls placed at respective loci.

More specifically, eutectic balls 10A are placed in respective intersection areas at which four corners of respective rectangular areas corresponding to respective individual base-substrates 1 on the base-substrate wafer 1A are adjacent to each other (see FIG. 12B). On each base-substrate 1, near a narrow end thereof, are two mounting pedestals 5 on which a respective quartz-crystal vibrating piece 4 is mounted. Each base-substrate 1 comprises a peripheral region of the inner main surface, on which a respective frame-shaped metallic film 6a is formed. Each cover 2 similarly has a respective peripheral region of the inner main surface, on which a respective frame-shaped metallic film 6b is formed. The metallic film 6b surrounds the respective concavity on the inner main surface of a cover 2. Each of the metallic films 6a, 6b extends to respective intersection areas. The center of each intersection area lacks an electrode but includes a respective small hole 11 for use in positioning a respective eutectic ball 10A. For assembly, the cover wafer 2A is aligned with and positioned on the base-substrate wafer 1A so that each cover 2 is aligned with a respective base-substrate 1. In other words, each frame-shaped metallic film 6a is aligned with a respective frame-shaped metallic film 6b. These metallic films 6a, 6b on the peripheries of the base-substrates 1 and covers 2 are bonded together by flow of molten eutectic metal resulting from melting of the eutectic balls 10A. Afterward, the resulting wafer sandwich is cut in longitudinal and lateral directions to separate individual quartz-crystal vibrators from each other.

By way of example, each base-substrate 1 in the base-substrate wafer 1A is rectangularly shaped with dimensions 3.2×1.5 mm. The width of the frame-shaped metallic film 6a is in the range of 50-250 µm, and the diameter of each small hole 11 is 20-50 µm. Each cover 2 on the cover wafer 2A has corresponding dimensions, and the width of the frame-shaped metallic film 6b is also in the range of 50-250 µm. The diameter of each eutectic ball 10A is in the range of 200-260 µm.

Figure 1B:
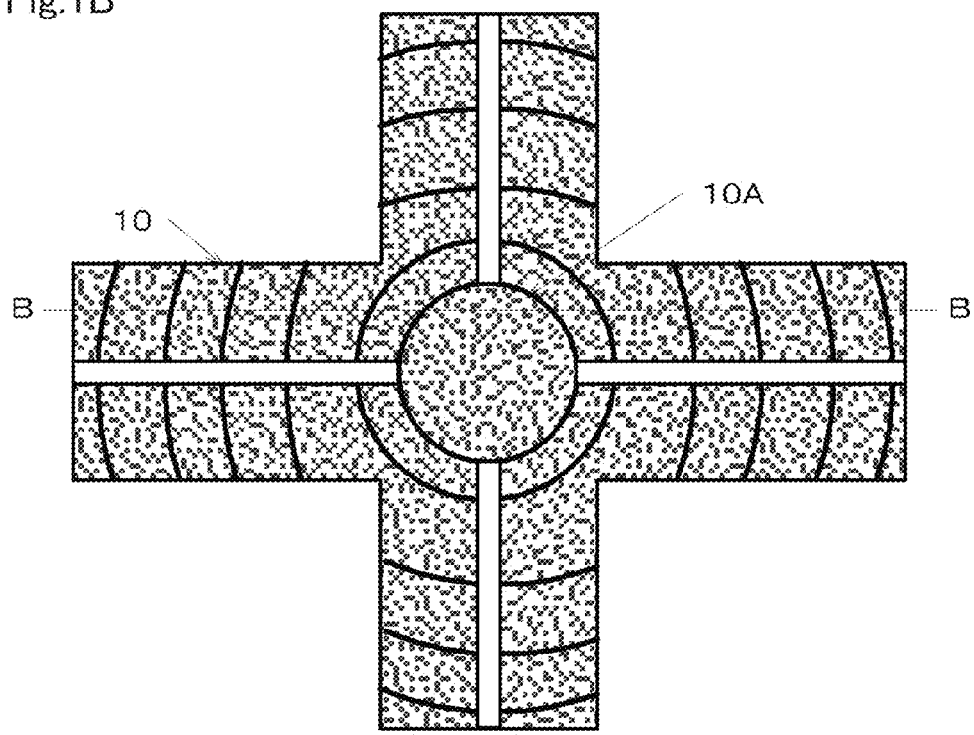
Figure 1C:
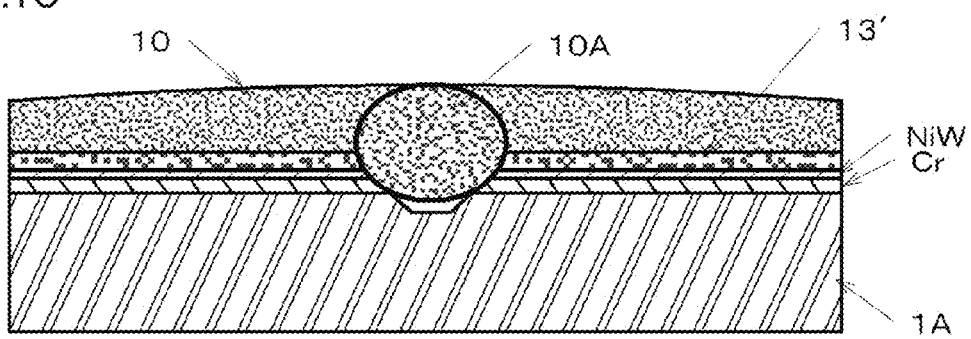

Each frame-shaped metallic film 6a, 6b, including their intersection areas, comprises a foundation layer of Cr, a surface layer of Au, and an intervening shielding layer of NiW (see FIGS. 1A and 1C). Exemplary thicknesses of the foundation layer (Cr), shielding layer (NiW), and the surface layer (Au) are 1000 Å, 300 Å, and 2000 Å, respectively; the shielding layer (NiW) is substantially thinner than either the foundation layer (Cr) or the surface layer (Au). The eutectic ball 10A comprises, for example, a AuSn eutectic (melting point: 280° C.) made of 80:20 (w/w) Au:Sn, a AuSi eutectic (melting point: 363° C.) made of 96.85:3.15 (w/w) Au:Si, or a AuGe eutectic (melting point: 356° C.) made of 88:12 (w/w) Au:Ge.

Generally, in this embodiment, the melting point of the eutectic ball 10A is higher than the melting point of the lead-free solder normally used for mounting the quartz-crystal vibrator onto a target substrate and lower than the transition-point temperature (573° C.) of the quartz crystal. If the melting point of the eutectic ball 10A were higher than the curing temperature (280° C.) of conductive adhesive, then the silicon-based resin in the conductive adhesive would be destroyed, resulting in substantial reduction in bonding strength. Thus, this embodiment desirably utilizes AuSn as the eutectic for the balls 10A since AuSn has the lowest melting point (280° C.) of any of the above-mentioned materials.

Figure 13A:
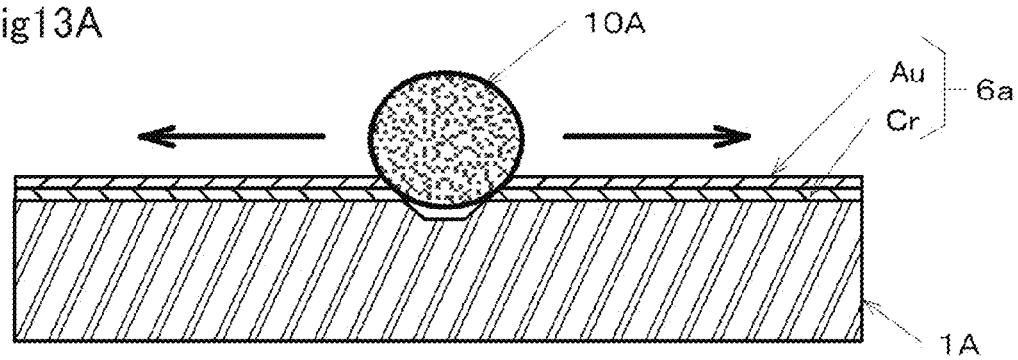
FIG. 13A is an enlargement of a region of a vertical section of a conventional base-substrate wafer showing a eutectic ball before melting.
Figure 13B:
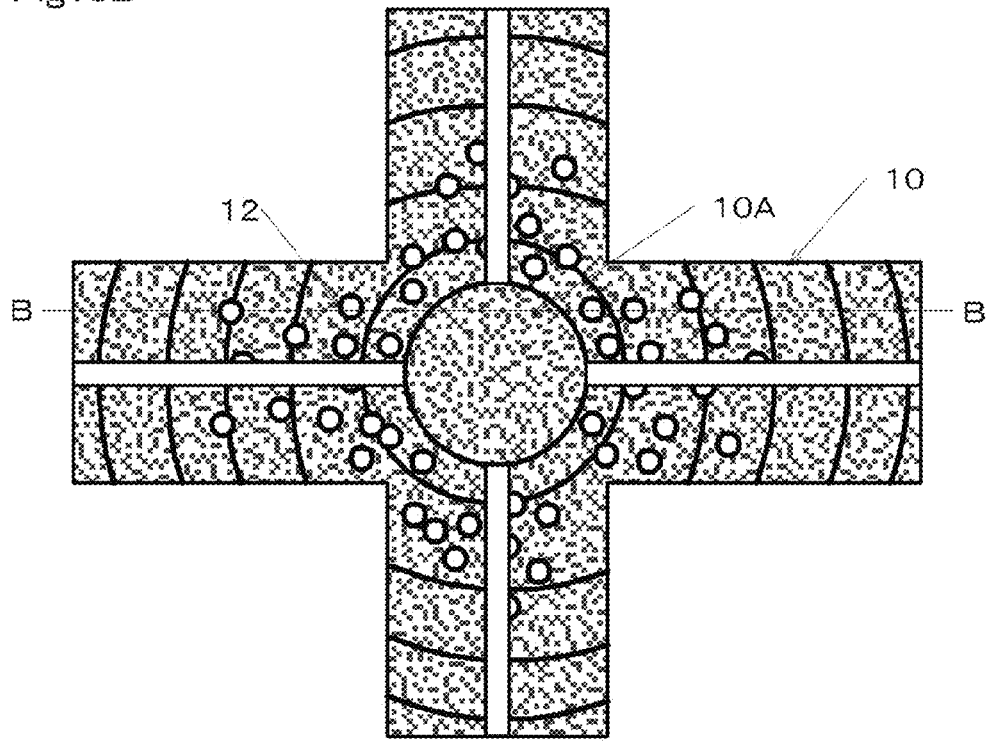
FIG. 13B is a plan view of the region shown in FIG. 13A after melting the eutectic ball.

Whenever a AuSn eutectic ball 10A, positioned in the small hole 11 in an intersection area on the base-substrate wafer 1A, is melted by heating to a temperature higher than its melting point (e.g., 380° C.), the following result occurs: Molten eutectic metal from the eutectic ball flows concentrically over the frame-shaped metallic films extending away from the small hole 11, as in the conventional examples discussed above (see FIG. 1B). The eutectic melt flows with a substantially uniform thickness from the intersection area (see FIG. 1C). In addition, no porosities are formed (FIG. 13B), which prevents exposure of the underlying base material of the base-substrate that occurs in conventional devices.

As noted above, NiW used as a shielding layer reduces out-diffusion of Au from the surface layer. Even if Au is out-diffused from the surface layer by the molten eutectic (producing a mixed layer 13'), the underlying layer of NiW and foundation layer of Cr nevertheless remain intact (see FIG. 1C), which prevents exposure of the underlying glass material of the base-substrate 1. As a result, molten eutectic (even molten eutectic in which some Au has diffused from the surface layer) flows uniformly over the frame-shaped metallic layers, thereby producing a substantially uniform thickness of eutectic solder bonding the covers and base-substrates together. The substantially uniform thickness of the eutectic securely seals the base-substrate 1 to the cover 2.

The shielding layer of NiW basically suppresses interdiffusion of Au from the surface layer and Cr from the foundation layer. This allows the thickness of the shielding layer (NiW) in this embodiment to be substantially reduced (e.g., 300 Å) relative to the respective thicknesses of the surface layer (Au: 2000 Å) and the foundation layer (Cr: 1000 Å). This is in contrast to making a shielding layer thicker than the respective thicknesses of a surface layer or foundation layer, as discussed in, e.g., JP Patent Publication No. 2003-332876 and Japan Patent No. 4,275,396 (in which the thickness of a Cr shielding electrode is 2000 Å, which is substantially greater than the thickness of the foundation electrode or of the conductive electrode). Further, whenever the base-substrate 1 and cover 2 are both made of glass, a Cr foundation layer allows the surface of the glass to be polished to a mirror finish without compromising adhesion of the layers to the glass surface.

Figure 2:
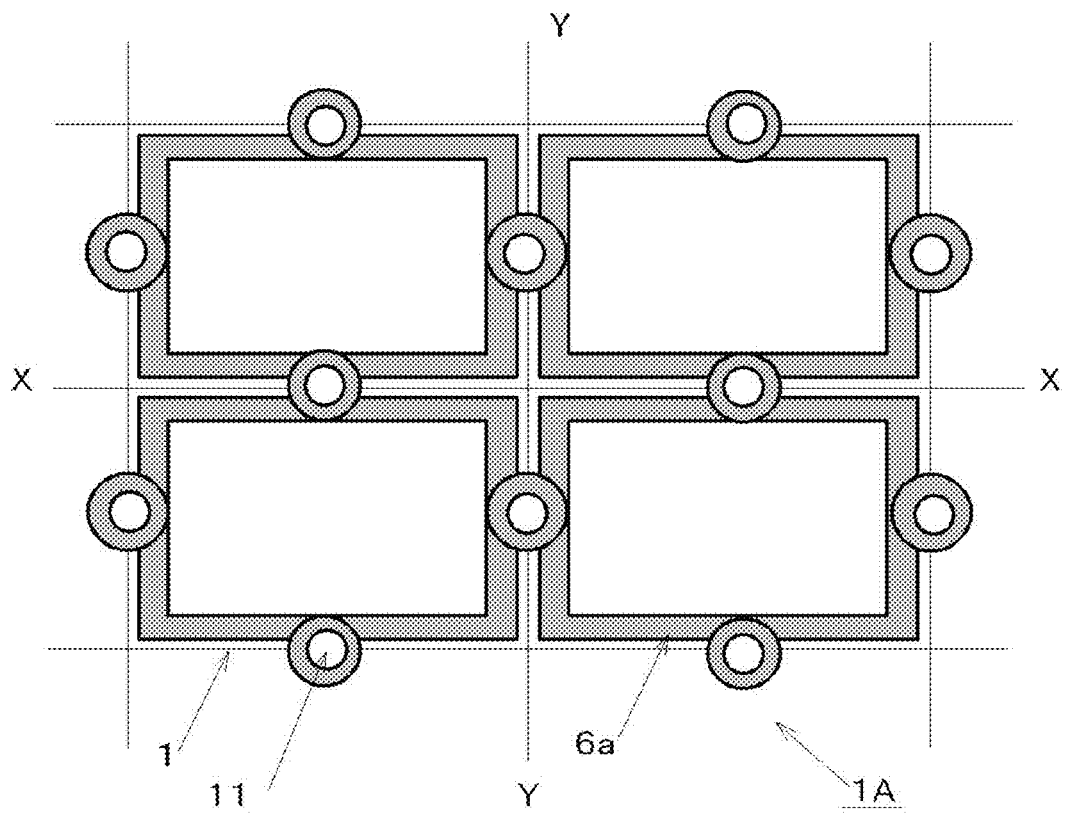
FIG. 2 is a plan view of a base-substrate wafer showing an alternative example of the frame-shaped metallic film in the first embodiment.
Figure 3A:
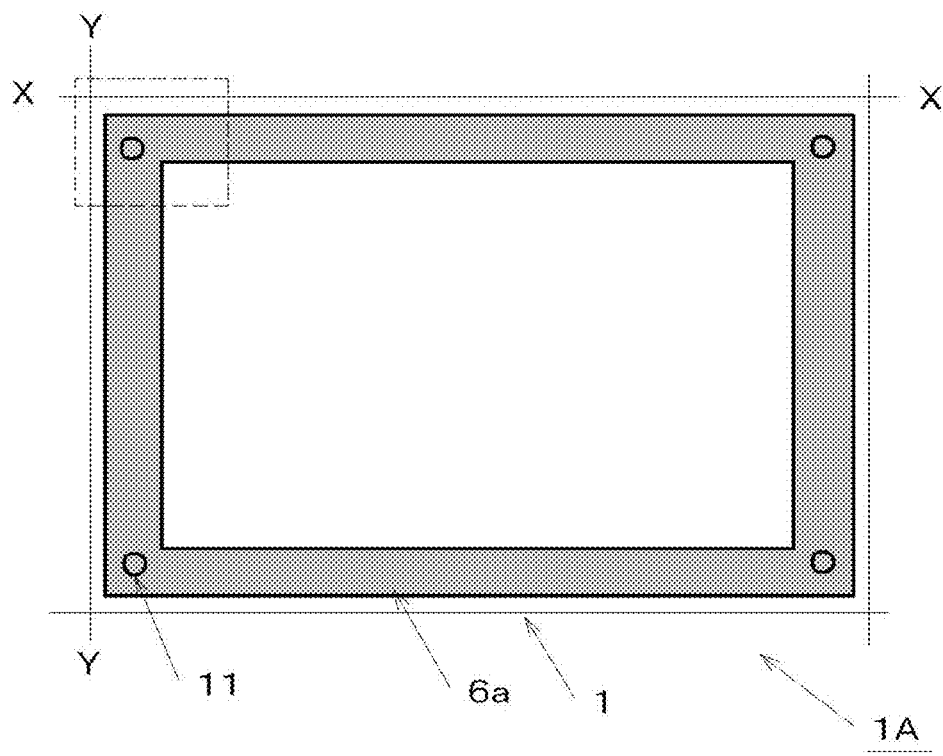
FIG. 3A is a plan view of the base-substrate wafer showing another example of a frame-shaped metallic film according to the first embodiment.
Figure 3B:
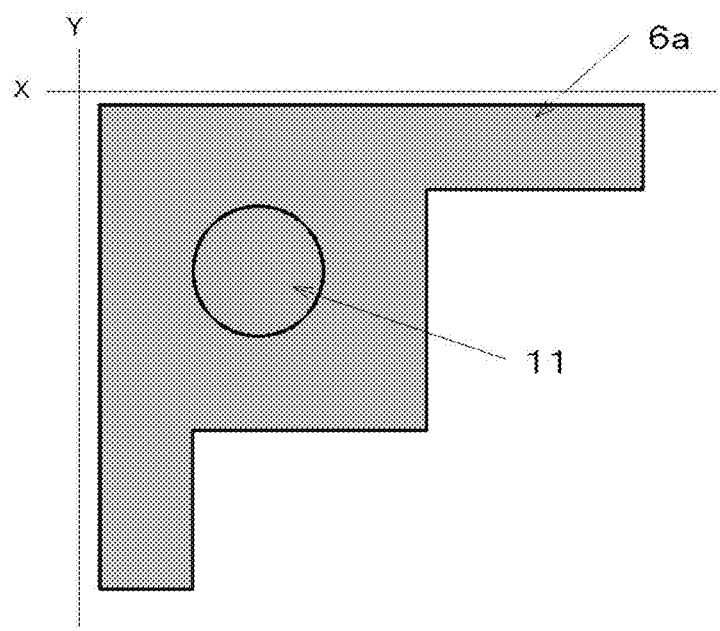
FIG. 3B is an enlarged view of the region in FIG. 3A circumscribed by a dashed line.

As an alternative to placing the eutectic balls 10A at respective loci in intersection areas on the base-substrate wafer 1A, the balls may be placed in respective small positioning holes 11 located in mid-length positions between adjacent sides of the metallic films 6a, as shown in FIG. 2. Further alternatively, as shown in FIG. 3, the eutectic balls 10A may be placed in small positioning holes 11 located in each corner of the frame-shaped metallic film 6a (FIG. 3A). An electrode may be formed over the entire area of the small hole 11 without exposing any base material on the bottom surface of the hole. In the configuration shown in FIG. 3B, each corner of the frame-shaped metallic film 6a may be projected inward so as to increase its area, which allows the eutectic ball 10A to be increased in size. Since the base material is exposed in the regions located between adjacent frame-shaped metallic films 6a, 6b, ease of wafer cutting is increased. Compared to the configurations shown in FIGS. 3A-3B, the configuration shown in FIG. 1 or 2 allows the number of eutectic balls 10A to be reduced by 25%, which increases processed efficiency.

Second Embodiment

This embodiment is described below with reference to FIGS. 4A-4B and 5A-5B. in this embodiment, components that are similar to corresponding components in the first embodiment have the same respective reference numerals and are not described further below.

A quartz-crystal vibrator according to this embodiment comprises a framed quartz-crystal vibrating piece 14, a base-substrate 15, and a cover 16. The framed quartz-crystal vibrating piece 14 is a plate-like member formed of, for example, AT-cut crystal material. The periphery of the quartz-crystal vibrating piece 14a comprises a frame portion 14b that surrounds the actual vibrating portion, wherein the vibrating portion is coupled to the frame portion 14b by a connecting bar 14c located at one end of the quartz-crystal piece 14a. As described above, the quartz-crystal piece 14a includes respective excitation electrodes 4a on both main surfaces thereof. Extraction electrodes 4b connect, via the connecting bar 14c, respective excitation electrodes to corresponding extraction terminals 4c located on diagonal corners.

Figure 5A:
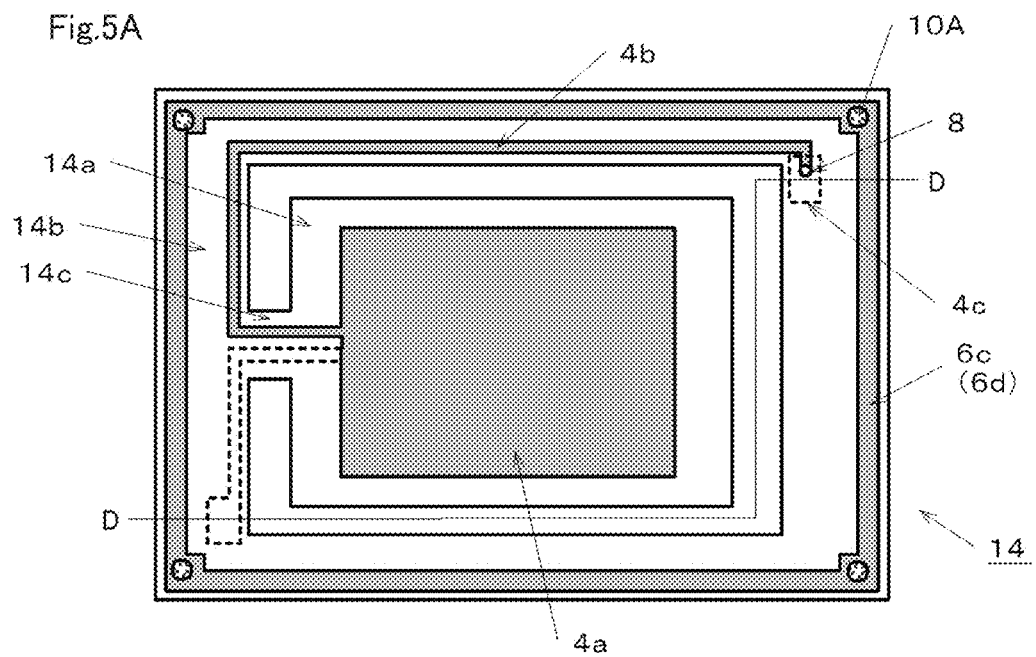
Figure 5B:
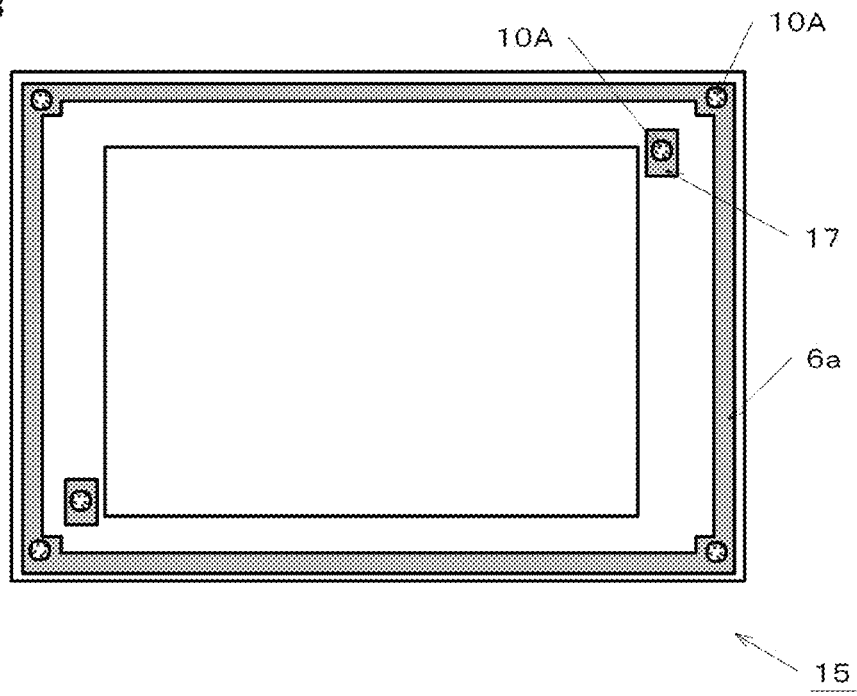

The extraction terminals 4c are formed on different main surfaces. The extraction electrode 4b on one main surface is connected electrically to the corresponding extraction terminal 4c via a through-electrode 8. The extraction terminals 4c may be formed on both main surfaces and connected electrically to each other via the through-electrode 8. Frame-shaped metallic films 6c, 6d are provided on the peripheral main surfaces of the frame portion 14b (FIGS. 5A and 5B).

The base-substrate 15 and cover 16 are formed of AT-cut quartz crystal having the same cutting angle as the framed quartz-crystal plate 14. The base-substrate 15 and cover 16 each have a respective concavity or recess in their main surfaces that face the quartz-crystal piece 14a. The concavities are surrounded by thicker peripheral regions on which respective frame-shaped metallic films 6a, 6d are formed. Frame-shaped metallic films 6b, 6c are also formed on respective main surfaces of the frame portion 14b of the quartz-crystal vibrating piece 14. These frame-shaped metallic films 6a, 6b and 6c, 6d align with each other whenever the base-substrate 15 and cover 16 are aligned with the quartz-crystal vibrating piece 14. The base-substrate 15 and cover 16 may be formed of Z-cut quartz-crystal material rather than AT-cut quartz crystal.

Each of the respective frame-shaped metallic films 6a-6d is formed by depositing a surface layer of Au on a shielding layer of NiW formed on a foundation layer of Cr. Thus, the shielding layer is interposed between the surface layer and the foundation layer. Placed at diagonal relationship to each other, respective connecting terminals 17 are located on respective corners of the base-substrate 15 (FIG. 5B). The connecting terminals 17 correspond to respective quartz-crystal extraction terminals 4c (FIG. 5A) located on respective diagonal corners of the frame portion 14b. The connecting terminals 17 are electrically connected, via through-electrodes 8, to respective mounting terminals 7 located on the bottom main surface.

For sealing the base-substrate 15 to the quartz-crystal vibrating piece 14, respective eutectic balls 10A are placed on the four corners of the frame-shaped metallic film 6a on the upper main surface of the base-substrate 15 and on the connecting terminals 17 on the upper main surface of the base-substrate; these balls are placed in contact with corresponding corner loci on the frame-shaped metallic film 6d and with corresponding extraction terminals on the lower main surface of the framed quartz-crystal plate 14. Similarly, respective eutectic balls 10A are placed on the four corners of the frame-shaped metallic film 6c on the upper main surface of the framed quartz-crystal plate 14; these balls are placed in contact with corresponding corner loci on the frame-shaped metallic film 6b on the lower main surface of the cover 16.

Figure 4A:
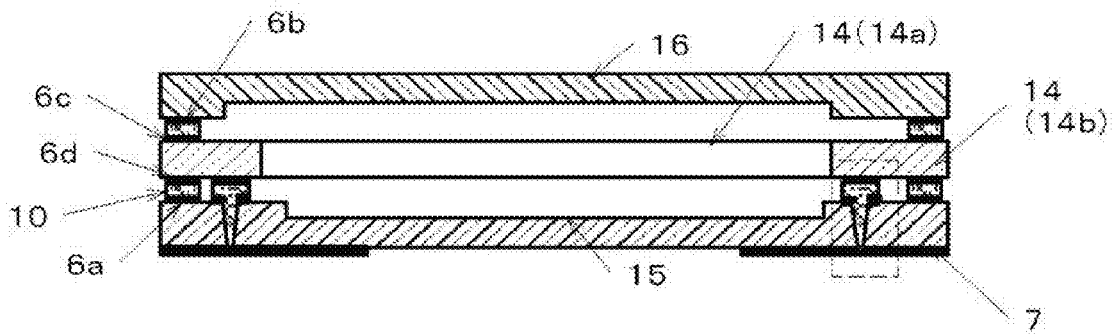
FIG. 4A is a cross-sectional view of a quartz-crystal vibrator according to a second embodiment.
Figure 4B:
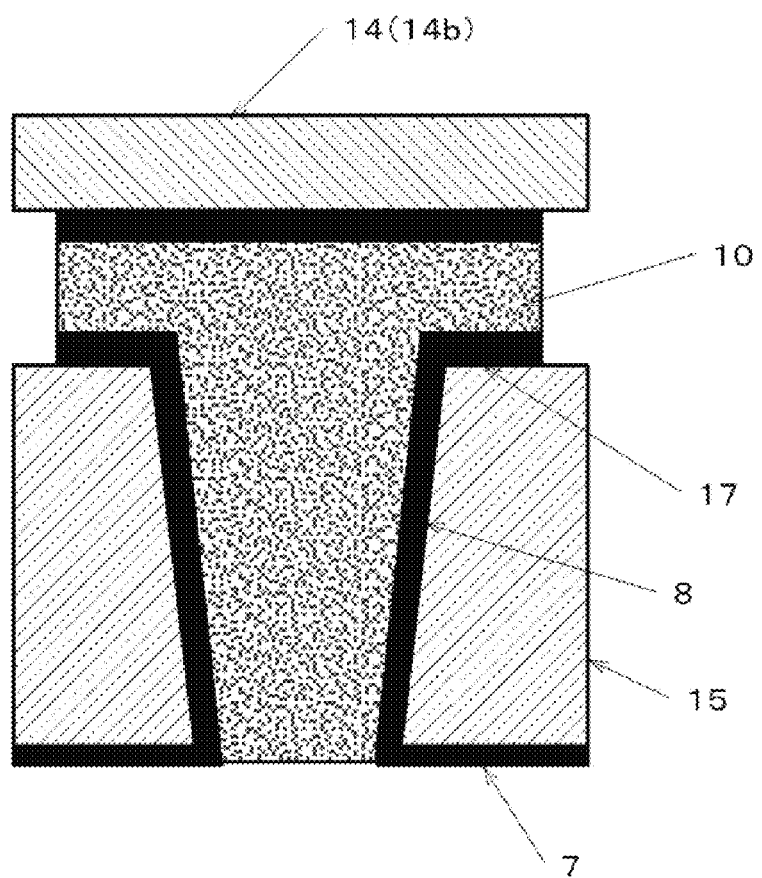
FIG. 4B is an enlarged view of the region in FIG. 4A circumscribed by a dashed line.

The eutectic balls 10A are melted by heat, which releases flow of molten eutectic metal from each corner over the surfaces of the metallic films 6a-6d to bond the opposing films together. Melting of the eutectic balls 10A located on connecting terminals 17 produces electrical connections of these terminals to respective extraction terminals 4c, as well as flow of molten eutectic metal into respective through-holes 8 to fill and seal them (FIG. 4B).

Each frame-shaped metallic film 6a-6d of this embodiment comprises a NiW shielding layer located between a foundation layer (Cr) and a surface layer (Au). Hence, as in the first embodiment, no porosities are formed that would otherwise expose the base material (quartz crystal) of the framed quartz-crystal 14. Also, the base-substrate 15 and cover 16 are sealed together by flow of molten eutectic metal from each corner of each frame-shaped metallic film 6a-6d with substantially equal thickness, thereby providing a substantially uniform thickness of eutectic as a function of distance.

Even though this embodiment has been described in the context of a single quartz-crystal vibrator, it will be understood from other descriptions herein that multiple quartz-crystal vibrators may be produced simultaneously from a sandwich comprising a quartz-crystal plate wafer, a base-substrate wafer, and a cover wafer. After joining the wafers together in the sandwich, the resulting package wafer is cut up into individual quartz-crystal vibrators.

Third Embodiment

Figure 13C:
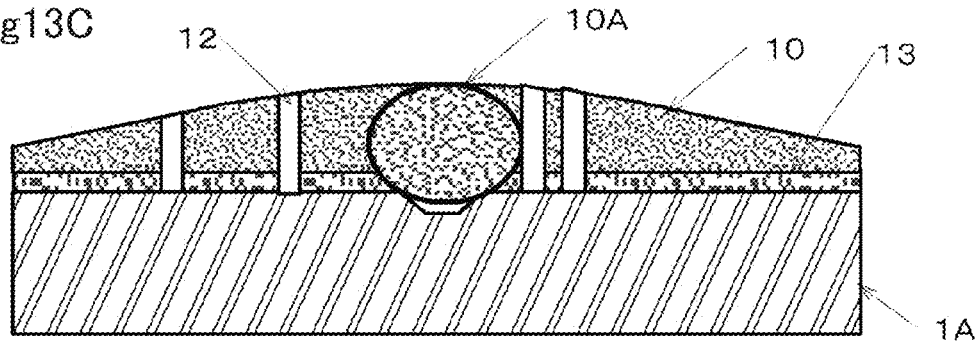
FIG. 13C is a vertical section along the line B-B in FIG. 13B.

The quartz-crystal vibrator 300 of this embodiment is mounted on a printed circuit board via the external mounting terminals 7 by soldering (performed with solder paste). The solder material is lead-free and comprises a tin-silver alloy or tin-zinc alloy. These solder pastes have melting points of approximately 220° C. and 190° C., respectively. When either of these alloys flows onto mounting terminals of conventional devices, the solder tends to draw gold from the surfaces of the mounting terminals, which tends to form porosities in the mounting terminals, similar to the porosities shown in FIG. 13, depending on circumstances. These porosities weaken the strength of the bonds between the base- substrate 31 and the mounting terminals 7. To avoid this problem, as described in the first and second embodiments, the mounting terminals 7 of this embodiment are configured with a foundation layer of Cr, a surface layer of Au, and a shielding layer of NiW. The shielding layer is interposed between the foundation layer and the surface layer. This type of quartz-crystal vibrator 300, in which the foundation layer and the surface layer of the mounting terminals 7 are Cr and Au, respectively, while the shielding layer is interposed between the foundation layer and the surface layer, is described below.

Figure 6:
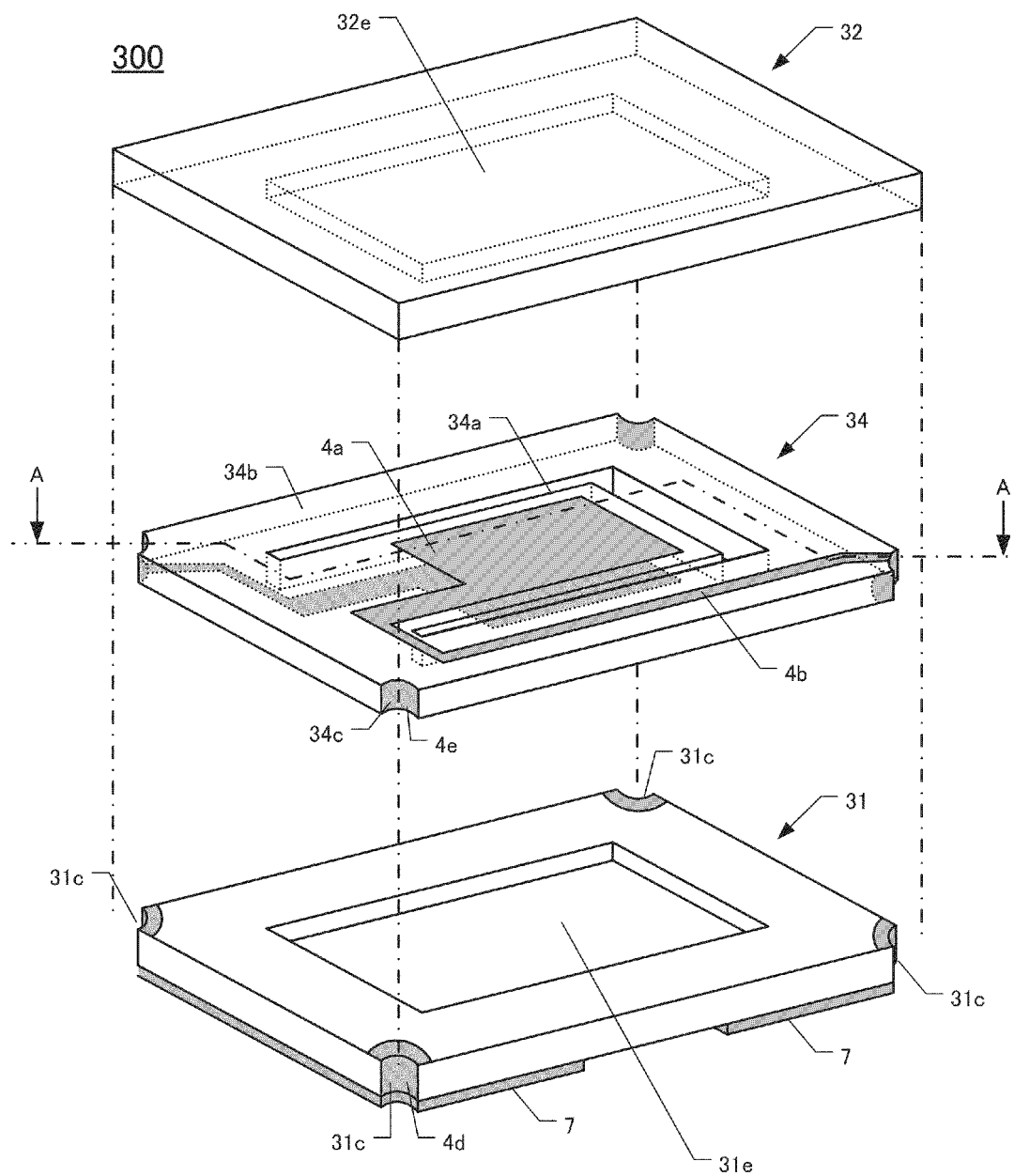
FIG. 6 is an exploded perspective view of an embodiment of a quartz-crystal vibrator.

Reference is made to FIG. 6, which is an exploded perspective view, in which the quartz-crystal vibrator 300 comprises a base-substrate 31, a cover 32, and a framed quartz-crystal plate 34. The framed quartz-crystal plate 34 comprises a quartz-crystal vibrating piece 34a and a frame portion 34b that surrounds the quartz-crystal piece 34a. The base-substrate 31 and cover 32 comprise respective recesses 31e, 32e on the upper main surface and lower main surface, respectively. The quartz-crystal piece 34a is sandwiched between the base-substrate and cover such that the respective recesses 31e, 32e face the quartz-crystal piece. The quartz-crystal piece 34a has upper and lower main surfaces on which respective excitation electrodes 4a are formed. Each excitation electrode 4a is connected electrically to a respective extraction electrode 4b situated on the frame portion 34b. The four outer corners of the frame portion 34b include respective castellations 34c. Each castellation 34c includes a respective side-face electrode 4e. The lower main surface of the base-substrate 31 comprises mounting terminals 7 formed thereon. The four outer corners of the base-substrate 31 include respective castellations 31c. Each castellation includes a respective side-face electrode that is connected electrically to a corresponding mounting electrode 7.

Figure 7A:
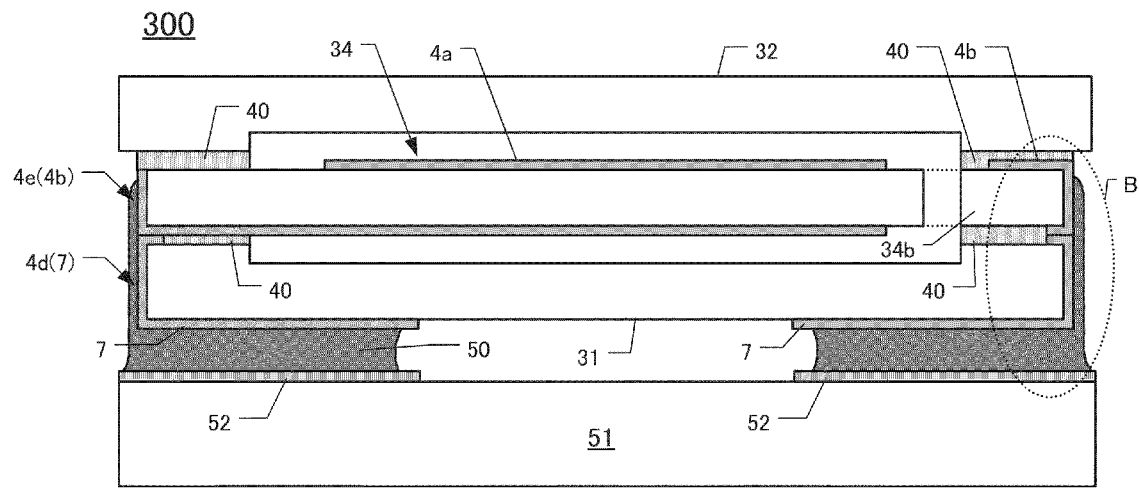
FIG. 7A is an elevational section of the quartz-crystal vibrator shown in FIG. 6 mounted on a printed circuit board.

FIG. 7A is an elevational section (along the line A-A in FIG. 6) of the quartz-crystal vibrator 300 of this embodiment mounted on a printed circuit board 51. For this mounting, electrodes 52 are provided on the printed circuit board 51. The quartz-crystal vibrator 300 is mounted to the printed circuit board 51 by connecting the mounting terminals 7 to respective printed-board electrodes 52 using an appropriate solder 50. In this quartz-crystal vibrator 300, low-melting-point (LMP) glass is applied between the framed quartz-crystal plate 34 and the base-substrate 31 and between the framed quartz-crystal plate 34 and the cover 32 to act as a sealing agent.

Figure 7B:
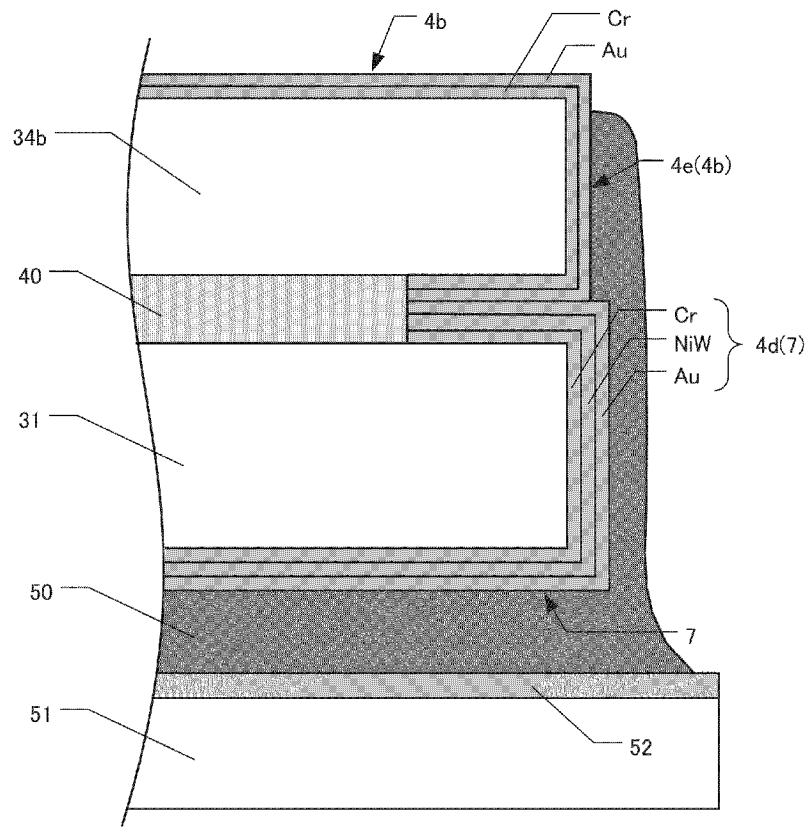
FIG. 7B is an enlargement of the region in FIG. 7A circumscribed by a dashed line B.

FIG. 7B is an enlargement of the region in FIG. 7A circumscribed by the dotted line B in FIG. 7A. The extraction electrode 4b and side-face electrode 4e of the framed quartz-crystal plate 34 each comprise two layers of metal, namely a foundation layer of Cr and a surface layer of Au. The mounting terminal 7 and side-face electrode 4d of the base-substrate 31 each comprise three metallic layers, namely a foundation layer of Cr, a surface layer of Au, and a shielding layer of NiW between the foundation layer and surface layer. The shielding layer (NiW) desirably is formed having a relatively large thickness. The shielding layer desirably is formed by sputtering, with a film thickness desirably in the range of 1500 Å to 2000 Å, the latter being the greatest thickness achievable by sputtering. The foundation layer (Cr) desirably has a thickness of less than 1000 Å, which is less than the thickness of the shielding layer. Since the foundation layer functions to provide high joint strength between the base-substrate 31 and the metallic films, this layer need not have a thickness greater than actually required.

A shielding layer formed thickly on the mounting terminals 7 prevents solder 50 from diffusing over the mounting terminals 7 to form porosities. Thus, high joint strength between the mounting terminals 7 and the base-substrate 31 is achieved.

In a quartz-crystal vibrator 300, a connection failure occurring between an extraction electrode 4b and a respective mounting terminal 7 can result in a defective product. To prevent this consequence even in the event of a connection failure, one or more additional plating layers can be formed on the surfaces of the mounting terminals 7 and extraction electrodes 4b. An alternative configuration of a quartz-crystal vibrator 300a having an additional plating layer 53 on the surfaces of the mounting terminals 7 and extraction electrodes 4b is described below.

Figure 8A:
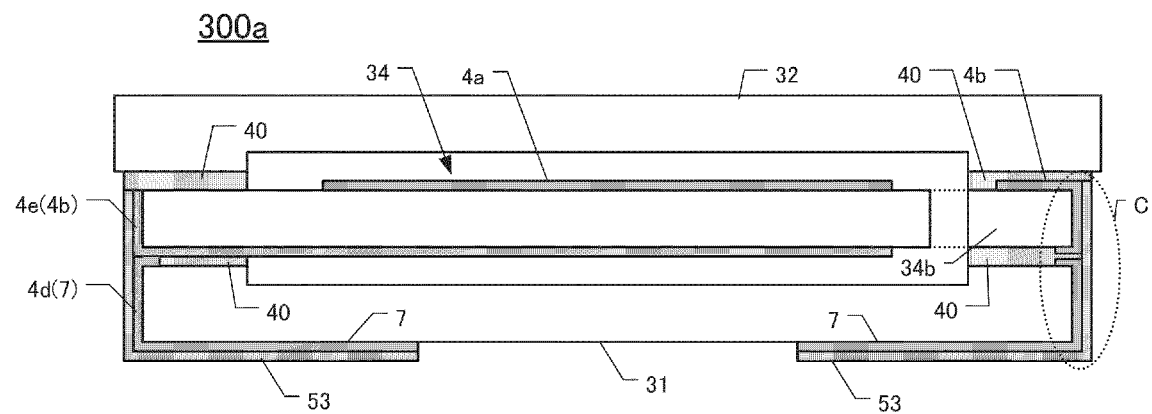
FIG. 8A is an elevational section of an embodiment of a quartz-crystal vibrator.

FIG. 8A is an elevational section of the quartz-crystal vibrator 300a. In the following description, components that are similar to respective components in the quartz-crystal vibrator 300 have the same respective reference numerals and are not described further.

After the quartz-crystal vibrator 300a is formed, a plating layer 53 is formed on each side-face electrode 4e (which is part of a corresponding mounting terminal 7) and on the extraction electrode 4b by electroless plating. The area circumscribed by the dotted line C shows an exemplary situation in which a mounting terminal 7 and extraction terminal 4b are not connected together.

Figure 8B:
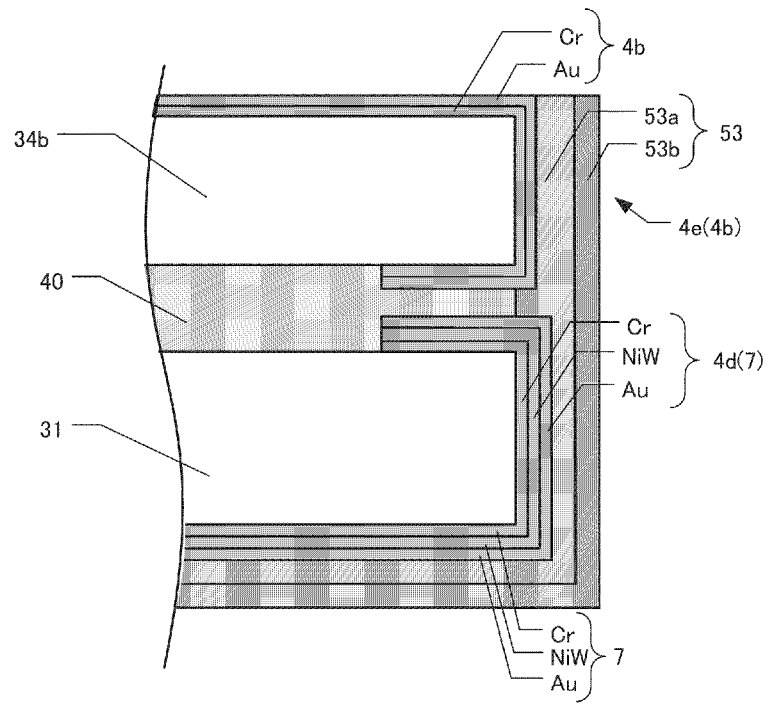
FIG. 8B is an enlarged view of the region in FIG. 8A circumscribed by a dotted line C.

FIG. 8B is an enlargement of the area circumscribed by the dotted line C in FIG. 8A. Although it is desirable to join the extraction electrode 4b directly with the corresponding mounting terminal 7, they are not joined together directly in FIG. 8B. However, in this alternative embodiment 300a, since a plating layer 53 is formed on the surfaces of the mounting terminals 7 and on the surfaces of the side-face electrodes 4e, the mounting terminals 7 and respective side-face electrodes 4e are connected together electrically via the plating layer 53. The plating layer 53 comprises a first plating layer 53a of nickel (Ni) and a second plating layer 53b of gold (Au). The first plating layer 53a is formed by plating with Ni by electroless plating so as to cover the mounting terminal 7 and the side-face electrode 4e. The second plating layer 53b is formed by plating with Au by electroless plating so as to cover the surface of the first plating layer 53a. The purpose of the first plating layer 53a and second plating layer 53b is to prevent interruption of the electrical connection of the mounting terminal 7 to the side-face electrode 4e. Thus, the plating layer 53 can be as thick as possible to prevent disruption of the electrical connection; for example, the first plating layer 53a and second plating layer 53b can have respective thicknesses in the range of 3-5 pm. The shielding layer (NiW) in the mounting terminals 7 prevents diffusion of Ni from the first plating layer 53a into the foundation layer (Cr) of the mounting terminals 7. The shielding layer (NiW) also prevents the first plating layer 53a from diffusing into the foundation layer (Cr) of the extraction electrodes 4b. Hence, it is desirable to form the shielding layer (NiW) of the mounting terminal 7 with a large thickness.

In another alternative configuration 300b, after the base-substrate 31, the framed quartz-crystal plate 34, and the cover 32 are joined together to form a quartz-crystal vibrator 300, the mounting terminals 7 may be formed. This alternative configuration 300b, in which the mounting terminals 7 are formed after joining together the base-substrate 31, framed quartz-crystal plate 34, and cover 32, is described below.

Figure 9A:
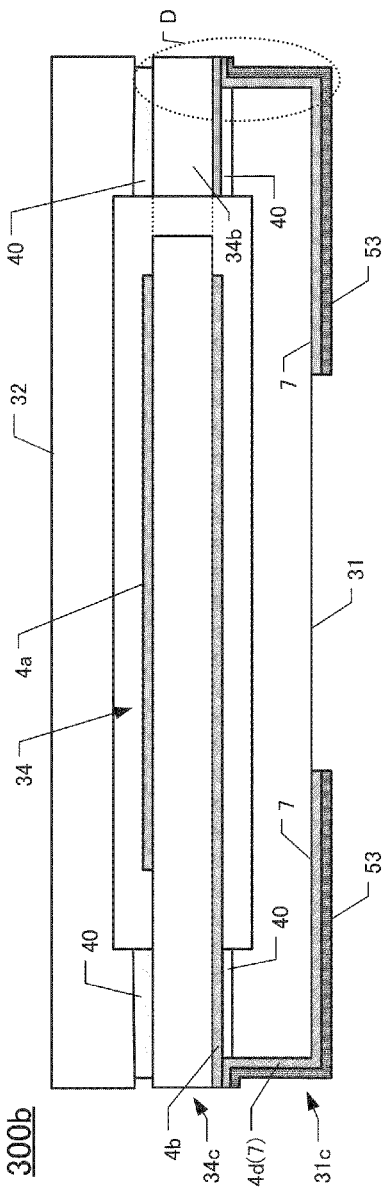
FIG. 9A is an elevational section of another embodiment of a quartz-crystal vibrator.

FIG. 9A is an elevational section of this alternative configuration of a quartz-crystal vibrator 300b. In the following description, components that are similar to corresponding components in the third embodiment 300 have the same respective reference numerals and are not described further.

After the base-substrate 31 is joined with the framed quartz-crystal plate 34 and the framed quartz-crystal plate 34 is joined with the cover 32, the mounting terminals 7 are formed. In this embodiment, no castellations 34c are formed on the frame portion 34b of the quartz-crystal vibrator 300b. With respect to the quartz-crystal vibrator 300, a respective extraction electrode 4b is formed on each of the upper and lower main surfaces of the frame portion 34b. In the alternative configuration 300b, the extraction electrodes 4b are formed only on the lower main surfaces of the frame portion 34b. Hence, after the base-substrate 31 is joined with the framed quartz-crystal plate 34, part of each extraction electrode 4b is exposed below the frame portion 34b. The extraction electrode 4b is connected electrically with the respective mounting terminal 7 in this exposed area below the frame portion 34b. The plating layer 53 is formed on the surface of the mounting terminals 7.

Figure 9B:
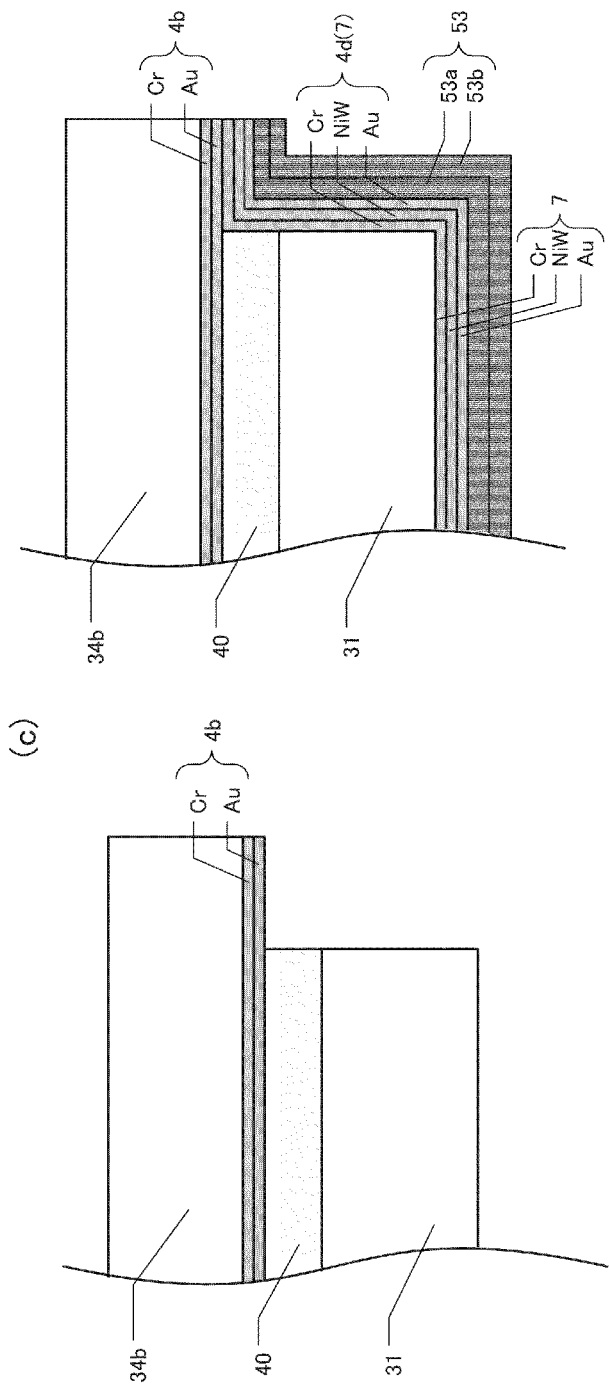
FIG. 9B is an enlargement of the region in FIG. 9A circumscribed by a dotted line D before a mounting terminal is formed.

FIG. 9B is an enlargement of the region, circumscribed by the dotted line D in FIG. 9A, before forming the mounting terminal 7. In FIG. 9B, the mounting terminals 7 are not formed even though the base-substrate 31 and framed quartz-crystal plate 34 are joined together. The extraction electrodes 4b have respective portions that are exposed outside the quartz-crystal vibrator 300b.

FIG. 9C is an enlargement of the region, circumscribed by the dotted line D in FIG. 9A, after forming the mounting terminals 7. In FIG. 9C, the mounting terminals 7 are formed on the quartz-crystal vibrator 300b shown in FIG. 9B; afterward, the plating layer 53 is formed. The mounting terminals 7 is formed in the following order: foundation layer (Cr), shielding layer (NiW), and surface layer (Au). Each layer is formed by sputtering. The plating layer 53 includes the first plating layer 53a and the second plating layer 53b. The first plating layer 53a is formed of Ni on the surface of the mounting terminals 7, and the second plating layer 53b is formed of Au on the surface of the first plating layer 53a. The first plating layer 53a and second plating layer 53b are formed by electroless plating. The thickness of each layer is 3-5 μm.

Since the thick plating layer 53 is formed on the surface of the mounting terminals 7 on the quartz-crystal vibrator 300b, this configuration exhibits reduced incidence of electrical disconnections arising from thermal contraction of material in certain use environments.

Quartz-crystal vibrators of the respective embodiments have been described above. In these embodiments the quartz-crystal piece is described as an AT-cut material exhibiting thickness-shear vibration mode or as a Z-cut material exhibiting a tuning-fork vibration mode. It will be understood that any of various other cut materials can also be used in these embodiments. Furthermore, the subject piezoelectric devices can be constructed of a piezoelectric material such as lithium tantalite, lithium niobate, or piezoelectric ceramic instead of quartz crystal. Additionally, principles and features described above may also be applied to quartz-crystal oscillators comprising a quartz-crystal and an IC chip.

What is claimed is:

1. A surface-mountable piezoelectric device, comprising:
a piezoelectric vibrating piece that vibrates at a predetermined frequency; and
a package comprising at least a cover and a base-substrate formed of glass or piezoelectric material, the piezoelectric vibrating piece being sealed within the package,
wherein the base-substrate and cover have respective inner and outer main surfaces with respective peripheral regions;
at least one inner main surface comprises a respective frame-shaped metallic film extending around the respective peripheral region, the frame-shaped metallic film being used for sealing the base-substrate and cover together using a eutectic material to form the package;
the outer main surface of the base-substrate including at least one mounting terminal; and
at least one of the frame-shaped metallic film and mounting terminal comprises a layer of chromium formed on a surface of the glass or piezoelectric material, a layer of NiW alloy formed on the layer of chromium, and a layer of gold formed on the layer of NiW alloy.

2. The piezoelectric device of claim 1, wherein:
the cover comprises a respective frame-shaped metallic film;
the base-substrate comprises a respective frame-shaped metallic film; and
the package comprises the cover and base-substrate bonded together by a eutectic material that has been melted in situ, allowed to flow over the frame-shaped metallic films, and hardened to form the package.

3. The piezoelectric device of claim 2, wherein the layer of NiW alloy in each frame-shaped metallic film is thinner than either the layer of chromium or the layer of gold.

4. The piezoelectric device of claim 2, wherein the layer of NiW alloy in each mounting terminal is thicker than the layer of chromium.

5. The piezoelectric device of claim 2, wherein:
the base-substrate comprises corner castellations; and
each mounting terminal comprises a respective side-face electrode situated in a respective castellation.

6. The piezoelectric device of claim 5, further comprising:
a layer of Ni formed on the gold layer; and
a layer of gold formed on the Ni layer.

7. The piezoelectric device of claim 6, wherein:
the Ni layer is a product of electroless plating and has a thickness of 3 μm to 5 μm; and
the gold layer formed on the Ni layer is a product of electroless plating and has a thickness of 3 μm to 5 μm.

8. The piezoelectric device of claim 1, wherein:
the piezoelectric vibrating piece has a periphery;
the package comprises a frame portion that surrounds the periphery of the piezoelectric vibrating piece, the frame portion comprising first and second main surfaces;
the cover and base-substrate include respective frame-shaped metallic films on their respective inner main surfaces;
both main surfaces of the frame portion include respective frame-shaped metallic films; and
the package comprises the base-substrate, frame portion, and cover bonded together by a solder that has been melted in situ, allowed to flow over the framed metallic films, and hardened to form the package.

9. The piezoelectric device of claim 8, wherein the layer of NiW alloy in each frame-shaped metallic film is thinner than either the layer of chromium or the layer of gold.

10. The piezoelectric device of claim 8, wherein the layer of NiW alloy in each mounting terminal is thicker than the layer of chromium.

11. The piezoelectric device of claim 8, wherein:
the base-substrate comprises corner castellations; and
each mounting terminal comprises a respective side-face electrode situated in a respective castellation.

12. The piezoelectric device of claim 11, further comprising:
a layer of Ni formed on the gold layer; and
a layer of gold formed on the Ni layer.

13. The piezoelectric device of claim 12, wherein:
the Ni layer is a product of electroless plating and has a thickness of 3 μm to 5 μm; and
the gold layer formed on the Ni layer is a product of electroless plating and has a thickness of 3 μm to 5 μm.

14. The piezoelectric device of claim 1, wherein:
the base-substrate comprises corner castellations; and
each mounting terminal comprises a respective side-face electrode situated in a respective castellation.

15. The piezoelectric device of claim 14, further comprising:
a layer of Ni formed on the gold layer; and
a layer of gold formed on the Ni layer.

16. The piezoelectric device of claim 15, wherein:
the Ni layer is a product of electroless plating and has a thickness of 3 μm to 5 μm; and
the gold layer formed on the Ni layer is a product of electroless plating and has a thickness of 3 μm to 5 μm.

17. The piezoelectric device of claim 1, wherein the layer of NiW alloy in each mounting terminal is thicker than the layer of chromium.

18. The piezoelectric device of claim 17, wherein:
the base-substrate comprises corner castellations; and
each mounting terminal comprises a respective side-face electrode situated in a respective castellation.

19. The piezoelectric device of claim 18, further comprising:
a layer of Ni formed on the gold layer; and
a layer of gold formed on the Ni layer.

20. The piezoelectric device of claim 19, wherein:
the Ni layer is a product of electroless plating and has a thickness of 3 μm to 5 μm; and
the gold layer formed on the Ni layer is a product of electroless plating and has a thickness of 3 μm to 5 μm.

21. The piezoelectric device of claim 1, wherein the solder comprises a eutectic alloy.

* * * * *